(12) United States Patent
Lee et al.

(10) Patent No.: US 10,258,956 B2
(45) Date of Patent: Apr. 16, 2019

(54) PHOTOLUMINESCENT CARBON NANOPARTICLES AND METHOD OF PREPARING THE SAME

(71) Applicant: KOREA BASIC SCIENCE INSTITUTE, Daejeon (KR)

(72) Inventors: Hyun-Uk Lee, Daejeon (KR); Jouhahn Lee, Daejeon (KR); So Young Park, Daejeon (KR)

(73) Assignee: Korea Basic Science Institute, Daejeon (KR)

( * ) Notice: Subject to any disclaimer, the term of this patent is extended or adjusted under 35 U.S.C. 154(b) by 0 days.

(21) Appl. No.: 15/585,565

(22) Filed: May 3, 2017

(65) Prior Publication Data

US 2018/0133680 A1    May 17, 2018

(30) Foreign Application Priority Data

Nov. 17, 2016   (KR) .................. 10-2016-0153579

(51) Int. Cl.
| | |
|---|---|
| *B01J 19/08* | (2006.01) |
| *H01J 37/32* | (2006.01) |
| *C09K 11/06* | (2006.01) |
| *C01B 32/18* | (2017.01) |
| *B82Y 20/00* | (2011.01) |
| *B82Y 40/00* | (2011.01) |

(52) U.S. Cl.
CPC .......... *B01J 19/081* (2013.01); *B01J 19/088* (2013.01); *C01B 32/18* (2017.08); *C09K 11/06* (2013.01); *H01J 37/3244* (2013.01); *H01J 37/32082* (2013.01); *H01J 37/32192* (2013.01); *B01J 2219/0877* (2013.01); *B01J 2219/0879* (2013.01); *B01J 2219/0894* (2013.01); *B82Y 20/00* (2013.01); *B82Y 40/00* (2013.01); *H01J 2237/32* (2013.01); *Y10S 977/774* (2013.01); *Y10S 977/901* (2013.01); *Y10S 977/95* (2013.01)

(58) Field of Classification Search
CPC .............. B01J 19/081; B01J 2219/0877; B01J 2219/0894; C01B 31/0293; C09K 11/06; H01J 37/32082; H01J 37/32192; H01J 37/3244; H01J 2237/32; B82Y 40/00; B82Y 20/00; Y10S 977/774; Y10S 977/901; Y10S 977/95
See application file for complete search history.

(56) References Cited

U.S. PATENT DOCUMENTS 9,505,623 B1 * 11/2016 Qin ..................... C01B 31/0446

OTHER PUBLICATIONS

Gokus, et al., Making Graphene Luuminescent by Oxygen Plasma Treatment, ACS Nano 2009; 3(12): 3963-3968.*
Park, et al., Photoluminescent Green Carbon Nanodots from Wood-Waste-Derived Sources: Large-Scale Synthesis, Properties, and Biomedical Applications, ACS Appl. Mater. Interfaces 2014; 6: 3365-3370.*

* cited by examiner

Primary Examiner — Daniel McCracken
(74) Attorney, Agent, or Firm — NSIP Law

(57) ABSTRACT

Photoluminescent carbon nanoparticles and a method of preparing the same are described herein. A method of preparing photoluminescent carbon nanoparticles includes obtaining carbon nanodots, and treating the carbon nanodots with plasma.

6 Claims, 5 Drawing Sheets
(2 of 5 Drawing Sheet(s) Filed in Color)

[Fig. 4]
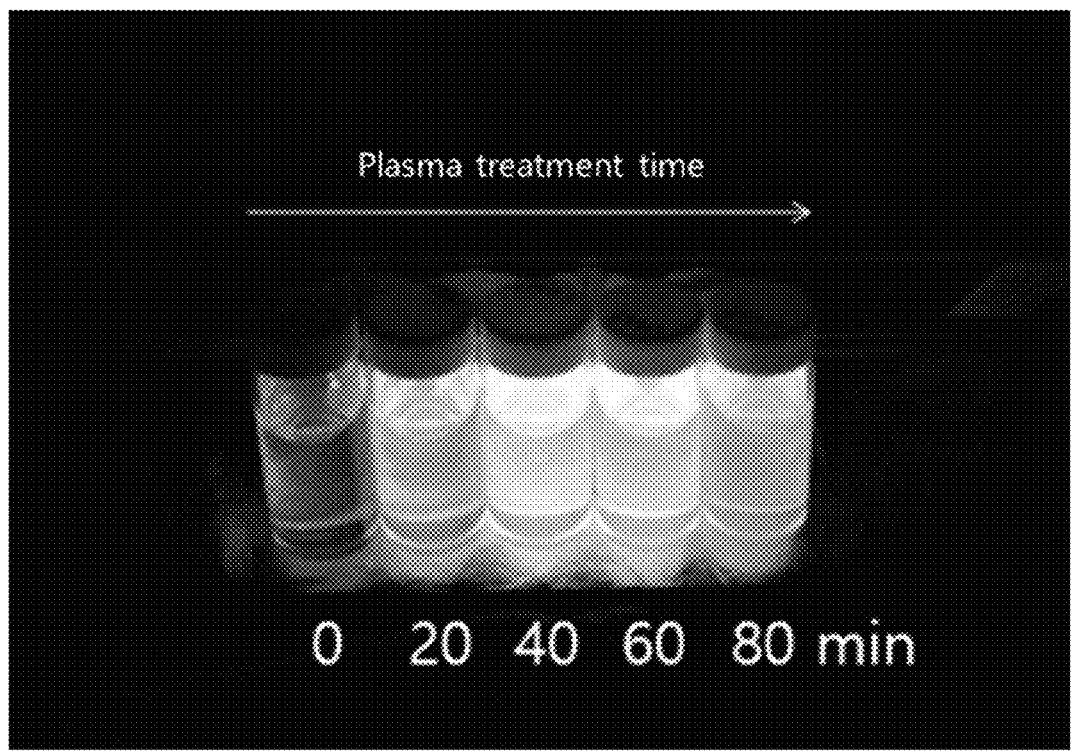

[Fig. 5]
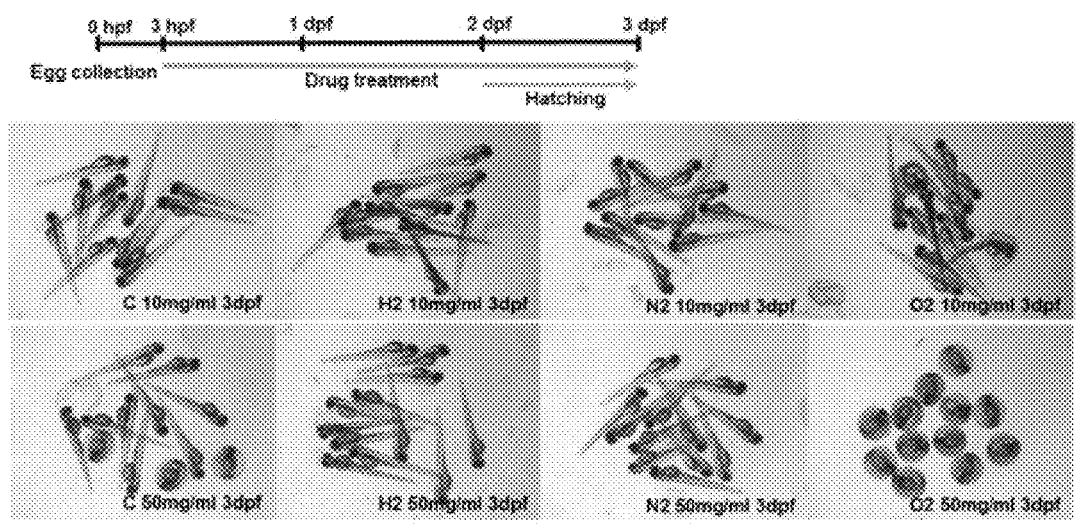

PHOTOLUMINESCENT CARBON NANOPARTICLES AND METHOD OF PREPARING THE SAME

CROSS-REFERENCE TO RELATED APPLICATION

This application claims the benefit under 35 U.S.C. § 119(a) of Korean Application No. 10-2016-0153579 filed on Nov. 17, 2016 with the Korean Intellectual Property Office, the entire disclosure of which is incorporated herein by reference for all purposes.

BACKGROUND

Field

The following description relates to photoluminescent carbon nanoparticles and a method for preparing thereof, and more particularly, to photoluminescent carbon nanoparticles with improved photoluminescent property and photoluminescent efficiency by treating carbon nanodots with plasma and a method of preparing the same.

Description of Related Art

Research on carbon nanomaterials started when fullerene (C) was discovered in 1985. Thereafter, carbon nanotube (CNT) was discovered at NEC research institute in Japan in 1991, and Andre Geim and Konstantin Novoselov first separated graphene in 2004 and received the Nobel Prize in Physics in 2010. Recently, in research trends, nanotechnologies become the mainstream while new physical phenomena and improved material characteristics in the ultrafine field are observed. Even in nanotechnology fields, particularly, carbon nanomaterials are expected to be one of the core materials of the industry leading to the next industrial revolution.

In general, quantum dot is a semiconductor nanoparticle with all three dimensions are in nanometers. An electrical property of the semiconductor is determined by the band gap. In a quantum dot, the band gap of the semiconductor material can be modulated by changing the characteristic dimension of the quantum dot. The band gap, thus, acts as a factor determining the photoluminescent properties of the quantum dot. In other words, a quantum dot emits photoluminescence because electrons are blocked in small particles, and light having different wavelengths is emitted according to a size of the quantum dot. The quantum dots are useful even for bioimaging, which visualizes living cells or tissues, but most of the quantum dots in the related art include toxic metal elements and are, therefore, generally difficult to be used in the field of biomedicine.

Carbon nanoparticles are also called carbon quantum dots or nanodots. Carbon nanoparticles are a new kind of photoluminescent material and have become an international research trend due to their chemical stability, no flicker light, resistance to light bleaching, non-toxic property, and excellent biocompatibility, beyond limitations of quantum dots in related art.

Conventional methods for synthesis of carbon nanoparticles may be largely divided into top-down methods and bottom-up methods. In a typical top-down method may include processes such as arc discharge, laser ablation, electrochemical oxidation, and the like, and typical bottom-up methods may include processes using combustion/thermal and microwave.

Carbon nanoparticles are generally easy to functionalize because of their strong hydrophilicity. Moreover, it is relatively easy to chemically treat materials including carbon nanoparticles because of the high chemical stability of carbon nanoparticles. Further, carbon nanoparticles are suitable to be used in bioanalysis or green industry because they not known to exhibit toxicity. In terms of optical characteristics, carbon nanoparticles have features such as easy adjustment of photoluminescent wavelength bands, high quantum yield, and no flickering. A nano sensor having high sensitivity may be developed by using the features.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of preparing photoluminescent carbon nanoparticles includes obtaining carbon nanodots, and treating the carbon nanodots with plasma.

The carbon nanodots may be suspended in a liquid.

The carbon nanodots may be prepared by treating an organic sample by any one method selected from ultrasonic irradiation, a hydrothermal method, a microwave method, and a sol-gel method.

The treating the carbon nanodots may include introducing a mixture of argon and a reactive gas in a plasma chamber used for treating the carbon nanodots with plasma. The reactive gas may be one or more of $N_2$, $H_2$, $O_2$, $F_2$, $CH_2$ and $CH_4$. Argon and the reactive gas may be mixed in a volume ratio of 10:90 to 90:10.

The treating the carbon nanodots comprises treating the carbon nanodots with plasma under an RF power of 70 W to 300 W for a treatment time of 5 minutes to 180 minutes.

In another general aspect, photoluminescent carbon nanoparticles prepared by the method disclosed herein are provided.

An absorption wavelength of the photoluminescent carbon nanoparticles may be 330 nm to 700 nm.

A photoluminescent wavelength of the photoluminescent carbon nanoparticles may be 350 nm to 800 nm.

In a further general aspect, a biocompatible photoluminescent source includes photoluminescent carbon nanoparticles prepared by the method disclosed herein.

In yet another general aspect, an optical element includes the photoluminescent carbon nanoparticles prepared by the method disclosed herein.

In a further general aspect, a paint including photoluminescent carbon nanoparticles prepared by the method disclosed herein is provided.

Other features and aspects will be apparent from the following detailed description, the drawings, and the claims.

BRIEF DESCRIPTION OF DRAWINGS

The patent or application file contains a least one drawing executed in color. Copies of this patent or patent application publication with color drawing(s) will be provided by the Office upon request and payment of the necessary fee.

In FIG. 2, Control illustrates carbon nanodots before plasma treatment; Plasma 1 illustrates photoluminescent carbon nanoparticles treated with plasma for 30 minutes under $Ar+O_2$ gas; and Plasma 2 illustrates photoluminescent carbon nanoparticles treated with plasma for 60 minutes under $Ar+O_2$ gas.

In FIG. 3, Control illustrates carbon nanodots before plasma treatment; $O_2$ plasma treated illustrates photoluminescent carbon nanoparticles treated with plasma under $Ar+O_2$ gas; $H_2$ plasma treated illustrates photoluminescent carbon nanoparticles treated with plasma under $Ar+H_2$ gas; and $N_2$ plasma treated illustrates photoluminescent carbon nanoparticles treated with plasma under $Ar+N_2$ gas.

FIG. 4 is a diagram illustrating photoluminescent efficiency of photoluminescent carbon nanoparticles according to a plasma treatment time, in accordance with an embodiment.

FIG. 5 is a diagram illustrating a toxicity test result of photoluminescent carbon nanoparticles treated with plasma, in accordance with an embodiment. In FIG. 5, C illustrates carbon nanodots before plasma treatment; $H_2$ 10 mg/ml 3 dpf illustrates that 10 mg/ml of photoluminescent carbon nanoparticles treated with plasma is treated under $Ar+H_2$ gas; $N_2$ 10 mg/ml 3 dpf illustrates that 10 mg/ml of photoluminescent carbon nanoparticles treated with plasma is treated under $Ar+N_2$ gas; $O_2$ 10 mg/ml 3 dpf illustrates that 10 mg/ml of photoluminescent carbon nanoparticles treated with plasma is treated under $Ar+O_2$ gas; $H_2$ 50 mg/ml 3 dpf illustrates that 50 mg/ml of photoluminescent carbon nanoparticles treated with plasma is treated under $Ar+H_2$ gas; $N_2$ 50 mg/ml 3 dpf illustrates that 50 mg/ml of photoluminescent carbon nanoparticles treated with plasma is treated under $Ar+N_2$ gas; and $O_2$ 50 mg/ml 3 dpf illustrates that 50 mg/ml of photoluminescent carbon nanoparticles treated with plasma is treated under $Ar+O_2$ gas.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
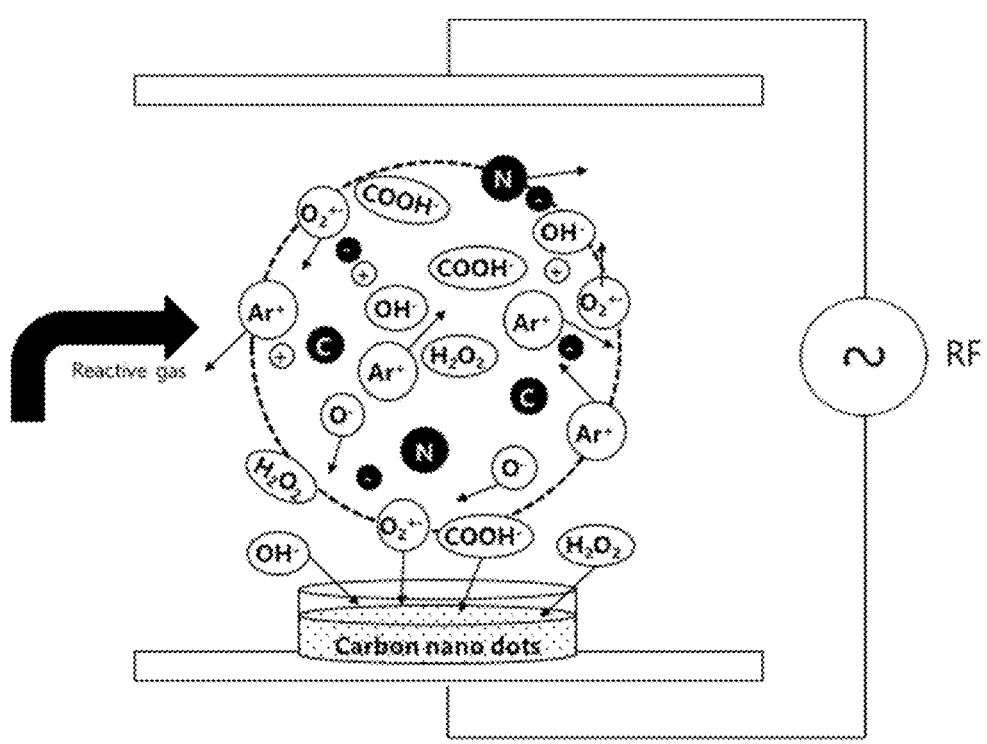
FIG. 1 is a schematic diagram illustrating a process of treating carbon nanodots with plasma, in accordance with an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The embodiments described herein provide a method of preparing photoluminescent carbon nanoparticles including treating carbon nanodots with plasma.

FIG. 1 is a schematic diagram illustrating a process of treating carbon nanodots with plasma according to an embodiment of the present disclosure The surface of the carbon nanodots is treated with the plasma while injecting various gases to form various functional groups which modify the surface of the carbon nanodots, thereby enhancing photoluminescent characteristics of the carbon nanodots.

In some embodiments, the carbon nanodots are obtained by treating an organic sample by any one method selected from ultrasonic irradiation, a hydrothermal method, a microwave method, and a sol-gel method.

Any suitable organic sample may be used to prepare carbon nanodots. A suitable organic sample typically includes a large amount of organic materials which can be usually decomposed by microorganisms. Examples of the organic sample include, but are not limited to, food waste, papers, vinyl or plastics (for example, PVA, PEG, PVP, gelatin, collagen, hyaluronic acid, etc.), woods, rubbers or leathers, textiles, metals, metal cans, porcelains, animal or vegetable waste oils (for example, animal fat may include fat obtained from beef, pork, chicken, or duck, and vegetable oils include, e.g., olive oil, sunflower seed oil or grape seed oil), industrial waste oils, biological samples (for example, cells, peptides, proteins, DNA, lipids, carbohydrates, etc.) or green algae.

The organic sample is mixed with a solvent if it is desirable to be prepared in a liquid state and then treated by any one method selected from ultrasonic irradiation, a hydrothermal method, a microwave method, and a sol-gel method.

The ultrasound irradiation may be performed by irradiating the organic sample to an ultrasound radiation of 1 to 10 MHz for about 10 to 500 minutes. The hydrothermal method may be performed by treating the organic sample with water at 0 to 300° C. under atmospheric pressure for about 10 to 300 minutes. In the microwave method, the organic sample is treated for 5 to 120 minutes in a conventional microwave oven with a radiation power of about 5 to 250 W. The sol-gel method may be performed through hydrolysis. Organic samples a carbon source were added to water and the solution was placed in a glass bottle which was treated by heating at 40 to 400° C. for 10 to 720 minutes. During the process, the solution changed from being colorless to brown indicating the formation of carbon nanodots.

The carbon nanodots thus prepared may be in a liquid or powder form. By liquid form, it is to be understood that the carbon nanodots are suspended in a liquid to form a free dispersion of the carbon nanodots. The liquid, in such embodiments, could be any suitable liquid that enables a stable suspension of the carbon nanodots. For example, the carbon nanodots may be suspended in water or an organic liquid.

The carbon nanodots prepared above are then treated with plasma. Without wishing to be bound by theory, it is contemplated that plasma treatment modifies the surface of the carbon nanodots by functionalizing the nanodot surface with functional groups such as, for example, $OH^-$, $COOH^-$, $NH_2^+$, etc., The functionalization may improve the photoluminescent properties of the nanodots such as, for example, photoluminescent intensity and photoluminescent efficiency. In some embodiments, functionalization may change the photoluminescent color of the carbon nanodots.

In various embodiments, the plasma treatment may be performed in presence of argon (Ar) and reactive gas. In some embodiments, plasma treatment is performed by injecting the gases in a chamber containing the carbon nanodots and applying a radio frequency electric field to the gases. As can be seen in FIG. 1, the electric field may be obtained by applying a sufficiently high voltage across electrodes separated by the appropriate gaseous mixture. In an embodiment, the carbon nanodots are placed at one of the electrodes inside the plasma chamber. In some embodiments, the electrodes are separated such that a distance between the center of the plasma and the sample substrate is about 1 to 10 cm. In other embodiments, the distance between the center of the plasma and the sample substrate may be about 1 to 7 cm. Without wishing to be bound by theory, it is contemplated that the distance between the center of the plasma and the sample substrate may be optimized by measuring a change in the improvement in the photoluminescent characteristics of the carbon nanodots as a function of the distance between the center of the plasma and the sample substrate.

It is further contemplated that while argon alone may result in improvement of the photoluminescent properties of the carbon nanodots, introduction of a reactive gas may further enhance the improvement in the photoluminescent properties of the carbon nanodots. Examples of the reactive gas include, but are not limited to, nitrogen ($N_2$), hydrogen ($H_2$), oxygen ($O_2$), fluorine ($F_2$), ethylene ($CH_2$), or methane ($CH_4$), or any combination thereof.

The mixing ratio of argon and the reactive gas is not particularly limited. For example, argon and the reactive gas may be mixed with a volume ratio of about 10:90 to about 90:10. Further, argon and the reactive gas may have a purity of 99% or more. In some embodiments, the gases are injected at a flow rate of 10 to 90 sccm and preferably a flow rate of 30 to 90 sccm. The chamber is maintained at atmospheric pressure before, during and after the plasma treatment.

Further, in certain embodiments, the plasma treatment is performed by supplying plasma power of about 30 to 300 W for about 5 to 180 minutes for 20 ml of carbon nanodots. Without wishing to be bound by theory, it is contemplated that the power and time for the plasma treatment depends on the reactive gases being used as well as the amount of carbon nanodots and the liquid in which they are suspended. The power and treatment time for the plasma treatment may be optimized based on the improvement in the photoluminescent properties. For example, if the improvement in photoluminescent properties is negligible, the power and/or treatment time may be increased. Similarly, if by increasing power and/or treatment time, no additional improvement in photoluminescent properties is observed, increasing the power or treatment time may be inefficient. For example, more power and/or treatment time may be desirable if more carbon nanodots are present.

Without wishing to be bound by theory, it is contemplated that surface of carbon nanodots treated with plasma is modified by the plasma treatment to significantly improve the photoluminescent properties, such as the enhancement of the photoluminescent intensity and the changes of the photoluminescent colors, as compared with the properties before the plasma treatment.

For example, generally, absorption wavelength and photoluminescent wavelength of carbon nanodots before plasma treatment in the range of 330 nm to 430 nm and 350 nm to 600 nm, respectively, while the photoluminescent carbon nanoparticles treated with plasma as described above may exhibit absorption wavelength in the range of 330 nm to 700 nm and photoluminescent wavelength in the range of 350 nm to 800 nm.

In one aspect, the present disclosure provides a biocompatible photoluminescent source, an optical element, or a paint including the photoluminescent carbon nanoparticles treated with plasma.

Because the plasma-treated photoluminescent carbon nanoparticles disclosed herein have excellent photoluminescent stability, light stability and chemical stability, safety without toxicity, and excellent bioaffinity and biocompatibility, they may be used in applications such as, for example, electrode materials, field emission displays (FEDs), field effect transistors (FETs), conductive paints, and polymeric materials, particularly, biological and medical materials.

Hereinafter, the present invention will be described in more detail by reference to Examples. However, Examples are just for the purpose of description and are not limited to the scope of the present disclosure.

Example 1. Preparation of Photoluminescent Carbon Nanoparticles

Preparation of Carbon Nanodots

A food waste sample as an organic waste was vacuum-filtered by using a filter paper and then further filtered by using a membrane filter with a size of 0.22 μm. The solid food waste was added with water as a solvent in a volume ratio of 1:10 to be prepared in a liquid state. The liquid food waste sample was irradiated with a ultrasound of 8 kHz at a temperature of 50° C. for 100 minutes to prepare liquid carbon nanodots as a free dispersion of fluorescent carbon quantum dots in water.

Plasma Treatment

The plasma treatment was performed by using a plasma treating system (Covance-MP; Femto-Science Co., Korea) including a 13.56 MHz RF generator (up to 300 W), electrodes, dielectric materials, a ceramic substrate, a diffuser, a sample stage, gas inlet/outlet, and a vacuum system. The liquid carbon nanodots were put in an open container, e.g., a dish, and placed on the sample stage adjusted to maintain a distance between center of the plasma and the sample substrate to be 7 cm, during plasma treatment. The volume and shape of the container is not particular limited so long as the container can be accommodated in the chamber and the sample substrate and does not affect plasma generation. Ar (with a flow rate of 50 sccm) and $O_2$ (with a flow rate of 50 sccm) were used as reactive gas. The liquid was treated at RF power of 200 W for 0 to 120 minutes. The chamber is maintained at atmospheric pressure during plasma treatment.

Example 2. Preparation of Photoluminescent Carbon Nanoparticles

Except for using Ar (50 sccm) and $H_2$ (50 sccm) as reactive gas during the plasma treatment in Example 1, Example 2 was performed the same as Example 1 to prepare the photoluminescent carbon nanoparticles.

Example 3. Preparation of Photoluminescent Carbon Nanoparticles

Except for using Ar (50 sccm) and $N_2$ (50 sccm) as the reactive gas during the plasma treatment in Example 1, Example 3 was performed the same as Example 1 to prepare the photoluminescent carbon nanoparticles.

Experimental Example 1. Photoluminescent Property According to Plasma Treatment Time In order to characterize the photoluminescent property of the photoluminescent carbon nanoparticles according to the plasma treatment time, photoluminescent (PL) intensity according to the plasma treatment time was measured by injecting Ar and $O_2$ and the results thereof were illustrated in FIG. 2. The photoluminescent carbon nanoparticles as well as untreated carbon nanodots (control) were irradiated with 410 nm light, and photoluminescent intensity of the respective particles was measured. PL spectra were recorded using a UV trans-illuminator (DUT-260; Core Bio System, Korea) to measure the optical properties of carbon nanodots. The excitation wavelength was 290-550 nm. In addition, UV/Vis absorption spectra were measured by a UV-Vis-NIR spectrophotometer (Varian, Cary 5000, Australia).

Figure 2:
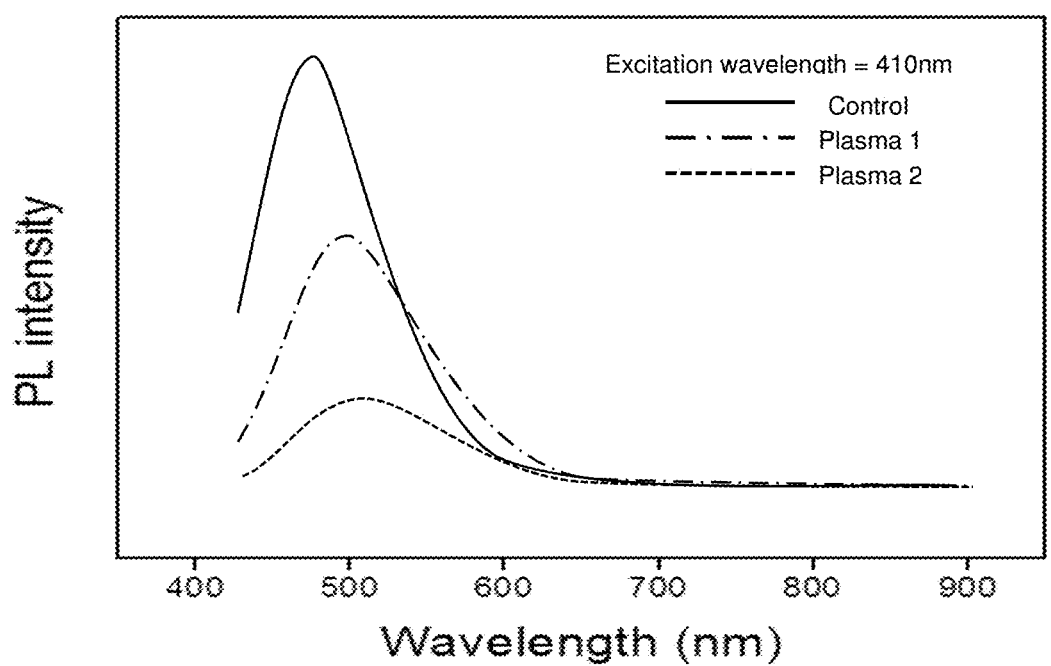
FIG. 2 is a diagram illustrating PL strength of photoluminescent carbon nanoparticles according to a plasma treatment time, in accordance with an embodiment.

As illustrated in FIG. 2, as compared with a control group without plasma treatment, it can be verified that the PL intensity of the photoluminescent carbon nanoparticles treated with plasma significantly increases as treatment time is increased from 30 minutes (plasma 1) to 60 minutes (plasma 2) when the reactive gas included Ar and $O_2$.

Experimental Example 2. Photoluminescent Property According to Reactive Gas

Figure 3:
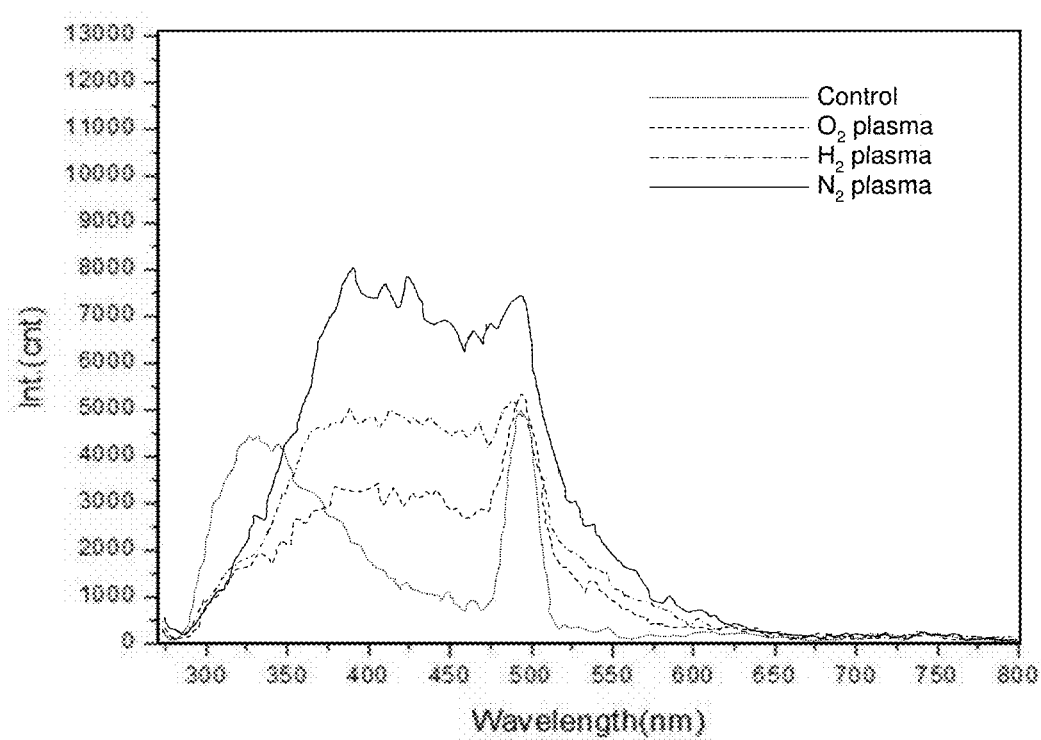
FIG. 3 is a diagram illustrating PL strength of photoluminescent carbon nanoparticles according to reaction gas injected during plasma treatment, in accordance with an embodiment.

In order to characterize the photoluminescent property according to the reactive gas injected during the plasma treatment, the PL intensity after plasma treatment was measured by mixing Ar with $O_2$, $H_2$ and $N_2$ as reactive gases, respectively, and the results thereof were illustrated in FIG. 3. A plasma treatment system (Covance-MP-Femto-Science Co., Korea) consisting of a 13.56 MHz radio frequency (RF) generator (upto 300 W), electrode, dielectric materials, ceramic substrate, diffuser, sample stage (size: 150×150 mm), gas inlet/outlet, and a vacuum system was used. Argon (50 sccm) was used as a carrier gas, and $H_2$, $N_2$, and $O_2$ (50 sccm) were separately used as reactive gases. The plasma treatment time was controlled within 60 min (plasma power: 200 W).

As illustrated in FIG. 3, as compared with a control group without plasma treatment, it can be verified that the PL strengths of the photoluminescent carbon nanoparticles are increased all in the cases of injecting $Ar+O_2$, $Ar+H_2$, and $Ar+N_2$ gases, respectively.

Experimental Example 3. Photoluminescent Efficiency According to Plasma Treatment Time Photoluminescent efficiency represents the sum of the luminescence of all particles in an ensemble. In order to characterize fluorescent intensity of the photoluminescent carbon nanoparticles according to a plasma treatment time, in Example 1, the carbon nanoparticles were treated with plasma ($Ar+O_2$) for 0, 20, 40, 60, and 80 minutes. After that, the photoluminescent efficiencies were compared. FIG. 4 qualitatively illustrates the differences in photoluminescent efficiencies of photoluminescent carbon nanoparticles treated for different times.

As illustrated in FIG. 4, the photoluminescent efficiencies of the photoluminescent carbon nanoparticles according to a plasma treatment time are different from each other. In particular, it can be observed that the photoluminescent efficiency of the photoluminescent carbon nanoparticles treated with the plasma for 40 minutes is highest.

Experimental Example 4. Evaluation of Biosafety of Photoluminescent Carbon Nanoparticles In order to evaluate biosafety and biocompatibility of the photoluminescent carbon nanoparticles prepared in Examples 1 to 3, a toxicity test was performed by a zebrafish test method.

Zebrafish Developmental Toxicity Assays: Zebrafish embryos were cultured at 28.5° C. in egg water. The developmental stage of the embryos was measured according to the standard procedure. This protocol was approved by the Korea Institute of Toxicology (KIT) Institutional Animal Care and Use Committee, and all of the experiments were performed in accordance with the guidelines of the Animal Care Ethics Committee of KIT. The healthy embryos were transferred to a 12-well plate along with 2 mL of E3 medium. The well-plate was treated with carbon nanodots (sample) suspended in E3 medium and incubated at 28.5° C. until 3 days. The morphological malformations of the larvae were observed and recorded by stereomicroscope (Nikon, Japan) connected to a digital camera.

First, collected zebrafish embryos were arranged in an inhibitory solution (1% DMSO) and then added with an embryo medium of 9 to 57 hpf (exposure for total 48 hrs). As a positive control group, 0.1, 1 and 10 mM of arbutin and 10, 25, 40 and 50 mM of kojic acid were used. The embryo was anesthetized with tricaine methanesulfonate (Sigma-Aldrich) and put on a descending slide (Aquatic Eco-Systems, Apopka, Fla., USA) with 1% methyl cellulose, and the photoluminescent carbon nanoparticles prepared in Examples 1 to 3 were injected in the amounts of 10 mg/ml and 50 mg/ml, respectively, and then an effect on a zebrafish pigment was evaluated until 1 day and 2 days elapse from 3 hours, and the results thereof were illustrated in FIG. 5. The zebrafish pigment was measured by using a stereomicroscope and trait-based evaluation of pigmentation was performed at 3 dpf.

As illustrated in FIG. 5, it can be verified that the photoluminescent carbon nanoparticles treated with the plasma under $Ar+O_2$, $Ar+H_2$, and $Ar+N_2$ gases have no toxicity at a concentration of 10 mg/ml and thus the biosafeties thereof are excellent.

Through the results, it can be seen that the photoluminescent carbon nanoparticles surface-modified by treating the carbon nanodots with plasma according to the present invention have excellent photoluminescent properties and photoluminescent efficiency, and safety without toxicity, and thus, can be used as biological and medical materials as well as electrode materials, conductive paints, and polymer materials for photoluminescence.

Although specific terminology has been used in this disclosure, it will be apparent after an understanding of the disclosure of this application that different terminology may be used to describe the same features, and such different terminology may appear in other applications.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of preparing photoluminescent carbon nanoparticles, the method comprising:
    obtaining carbon nanodots; and
    treating the carbon nanodots with plasma under an RF power of 70 W to 300 W for a treatment time of 5 minutes to 180 minutes.

2. The method of claim 1, wherein the treating the carbon nanodots comprises suspending the carbon nanodots in a liquid.

3. The method of claim 1, wherein the carbon nanodots are prepared by treating an organic sample by any one method selected from ultrasonic irradiation, a hydrothermal method, a microwave method, and a sol-gel method.

4. The method of claim 1, wherein the treating the carbon nanodots comprises introducing a mixture of argon and a reactive gas in a plasma chamber used for treating the carbon nanodots with plasma.

5. The method of claim 4, wherein the reactive gas is one or more of $N_2$, $H_2$, $O_2$, $F_2$, $CH_2$ and $CH_4$.

6. The method of claim 4, wherein argon and the reactive gas are mixed in a volume ratio of 10:90 to 90:10.

* * * * *